United States Patent [19]

Skertic

[11] Patent Number: 5,057,490
[45] Date of Patent: Oct. 15, 1991

[54] LOW-TEMPERATURE THERMOELECTRIC REFRIGERATING DEVICE USING CURRENT-CARRYING SUPERCONDUCTING MODE/NONSUPERCONDUCTING MODE JUNCTIONS

[75] Inventor: Matthew M. Skertic, Chatsworth, Calif.

[73] Assignee: Hughes Aircraft Company, Los Angeles, Calif.

[21] Appl. No.: 427,676

[22] Filed: Oct. 26, 1989

[51] Int. Cl.$^5$ .................... H01B 12/00; F25B 21/00
[52] U.S. Cl. ............................... 505/1; 62/3.2; 505/888; 505/891
[58] Field of Search ............... 62/3.2, 3.1, 3.3, 700, 62/701; 505/888, 889, 891, 1, 801

[56] References Cited

U.S. PATENT DOCUMENTS 4,362,023  12/1982  Falco ........................... 62/3.2
4,493,939  1/1985   Blaske et al. ................. 62/3.2

OTHER PUBLICATIONS

Choi et al, Crystal Physics & ..., "The n-p Transition in YBa$_2$Cu$_3$O$_{6.5+x}$", 12/4/87.

Primary Examiner—Henry A. Bennett
Assistant Examiner—John Sollecito
Attorney, Agent, or Firm—C. D. Brown; R. M. Heald; W. K. Denson-Low

[57] ABSTRACT

A refrigerating device (34 or 46) is formed using a refrigerating unit (10) having a hot end (32) at which heat is transferred to a heat sink (22), a cold end (30) at which heat is transferred from a cooling load (28) to the unit (10), a first junction (14) of a material (16) carrying electrical current in a nonsuperconducting mode to a material (12) carrying electrical current in a superconducting mode nearest the hot end (32), a second junction (18) of a material (12) carrying electrical current in a superconducting mode to a material (20) carrying electrical current in a nonsuperconducting mode nearest the cold end (30), and an electrical current source (24) that forces a flow of electrical current in the direction from the first junction (14) toward the second junction (18). As the electrical current flows, heat is transferred from the cooling load (28) into the cold end (30), and expelled to the heat sink (22) at the hot end (32). Preferably, a number of the refrigerating units (10) are connected electrically in series, to form single stage (34) or multistage (46) refrigerating devices.

21 Claims, 2 Drawing Sheets

LOW-TEMPERATURE THERMOELECTRIC REFRIGERATING DEVICE USING CURRENT-CARRYING SUPERCONDUCTING MODE/NONSUPERCONDUCTING MODE JUNCTIONS

BACKGROUND OF THE INVENTION

This invention relates to devices that provide low-temperature cooling, and, more particularly, to a solid state refrigerating device utilizing superconducting transitions to achieve cooling.

Many types of devices are operated at very low temperatures, such as, for example, 100K or less. In some cases, low temperature operation is required because physical or chemical processes of interest occur only at low temperature or are more pronounced at low temperature, and in other cases because some types of electrical-thermal noise are reduced at low temperature. An approach to cool the device to low temperature is therefore required as a basic part of such a system.

Cooling to low temperature becomes more difficult as the required temperature is reduced toward absolute zero. The simplest and most convenient approach to cooling a device to a low operating temperature is to immerse it in a liquid gas whose boiling point is at or above the desired operating temperature. This immersion ensures that the temperature of the device will not exceed the boiling point of the liquefied gas. Liquid nitrogen, having a normal boiling point of 77.4K, is readily available at a modest cost. Other liquid gases required to achieve lower temperatures, such as liquid neon and liquid helium having normal boiling points of 27.2K and 4.2K, respectively, are available but much more expensive.

While an immersion approach is preferred for laboratory and other stationary cooling requirements, the cooling of small devices in mobile apparatus, or other situations that make the use of liquid coolants difficult, requires another approach. For example, it may not be possible to provide liquefied gas to a device operated in a remote site, or in space. Also, it may be inconvenient or impossible to periodically service devices stored for long periods of time before use with liquefied gas.

Various approaches have been developed to keep apparatus cold without using liquefied gas as an immersion coolant. For example, gas expansion coolers expand compressed gas through an orifice, thereby cooling the gas and resulting in absorption of heat from a cooling load. Several types of thermoelectric devices can also be used for cooling. Such thermoelectric refrigerating devices are convenient, because only electrical power is required to achieve cooling and electrical power is available nearly everywhere. Thermoelectric devices are typically used in a stand alone cooler, heat sinked to ambient environment.

There is a continuing need for refrigerating devices that can cool to low temperature with a high cooling power. The present invention fulfills this need, and further provides related advantages.

SUMMARY OF THE INVENTION

The present invention provides a refrigerating device that operates from a heat sink to add a low-temperature cooling increment. It utilizes only electrical power to achieve the cooling. In a typical application, the refrigerating device adds single or multiple stages of cooling below the temperature achievable with an existing liquefied gas heat sink or expansion cooler, permitting even colder temperatures to be reached. The refrigerating device of the invention is compact and readily constructed. It has a high cooling power and can provide continuous cooling to a temperature near absolute zero.

In accordance with the invention, a refrigerating device that produces cooling below a preselected temperature comprises a heat sink operable to produce the preselected temperature; a refrigerating unit, including a first piece of a first material that is electrically conducting but not superconducting at the preselected temperature, a second piece of a second material that is superconducting at the preselected temperature, the second piece being electrically connected to the first piece at a first junction, the first piece and the second piece being in thermal communication with the heat sink in the region of the first junction, and a third piece of a third material that is electrically conducting but not superconducting at the preselected temperature, the third piece being electrically connected to the second piece at a second junction; and means for causing an electrical current to flow from the first piece, into the second piece, and into the third piece. Thus, the first junction is at the "hot end" of the refrigerating device adjacent the heat sink, and the second junction is at the "cold end" that receives heat from the structure to be cooled.

In this device, heat flows from the structure to be cooled into the refrigerating device in the neighborhood of the second junction. The heat energy extracted from the structure is transferred to the heat sink through electronic interactions of the electrical current flow. The refrigerating device thereby provides an increment of cooling below the temperature of the heat sink.

The refrigerating device can be made in any acceptable form and from any operable material. The preferred approach is to provide the superconducting and nonsuperconducting materials as strips of thin films on a nonconducting substrate, such as glass. The superconductor material and the nonsuperconductor material may be the same material, with the difference in conduction mode attained, for example, by decreasing the cross sectional area of the nonsuperconductor piece so that the material exceeds its critical current during operation and is driven normal. Alternatively, the superconducting material and the nonsuperconducting material may be entirely different materials, one of which conducts electrical current in the superconducting mode and one of which conducts electrical current in the nonsuperconducting mode, at the heat sink temperature.

A number of the basic refrigerating units such as described above can be combined together by connecting them in an electrical series arrangement operating from the same heat sink, to multiply the total cooling power of the device. The basic refrigerating units can also be structured in multiple stages, with the cold end of the first stage acting as the hot end heat sink for the second stage, so that the second stage cold end reaches a temperature lower than that of the first stage cold end.

The choice of the superconducting material is based, in part, on the reduced temperature to be attained and the heat sink temperature. The heat sink must maintain the superconducting material in the superconducting state, and therefore the critical temperature $T_c$ of the superconducting material must be higher than the heat sink temperature. If the heat sink temperature is liquid helium temperature, for example, a conventional superconducting material can be used.

However, it is desirable to use the highest heat sink temperature possible, because a high heat sink temperature is easier to maintain than a low temperature. On the other hand, a low cooling load temperature may dictate a lower heat sink temperature to avoid multi-staging complexity. Since the cooling power is generally proportional to the energy gap of the superconductor, which in turn is generally proportional to $T_c$, the use of a high critical temperature ($T_c$) superconductor is desirable. The highest $T_c$ materials known at present are the complex ceramic oxide materials, that can be fabricated as n-type and p-type conductors, referring to whether the majority carrier type is electrons or holes. The direction of electric current flow is stated herein to provide cooling in the n-type material. The current direction would be reversed when using p-type material. Such superconducting materials are known in the art, and no other limitation on their selection is known.

The present invention provides an important advance in the art of refrigerating devices that achieve cold temperatures, particularly in the cryogenic range. The device provides an incremental decrease in temperature from a heat sink temperature, using only an electrical current passed through the device. Other features and advantages of the invention will be apparent from the following more detailed description of the invention, taken in conjunction with the accompanying drawings, which illustrate, by way of example, the principles of the invention.

DETAILED DESCRIPTION OF THE INVENTION

In accordance with the present invention, a refrigerating device comprises a refrigerating unit, including a first piece of a first material that carries current in the nonsuperconducting mode, a second piece of a second material that carries current in the superconducting mode, a third piece of a third material that carries current in the nonsuperconducting mode, a first junction between the first piece of material and the second piece of material, and a second junction between the second piece of material and the third piece of material; heat sink means adjacent and in thermal communication with the first junction for maintaining the second piece of material below its superconducting transition temperature; and electrical current means for causing an electrical current to flow from the first piece of material, into the second piece of material, and into the third piece of material.

Figure 1:
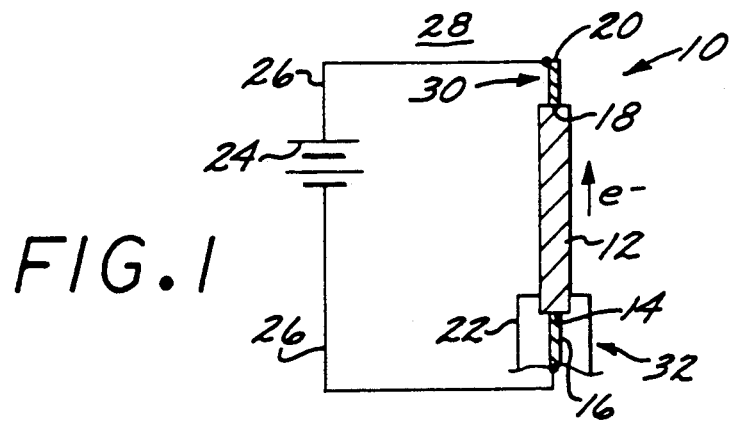
FIG. 1 is a schematic plan view of a single refrigerating unit on a substrate.

As illustrated in FIG. 1, a refrigerating or cooling unit 10 includes a piece of a superconducting material 12. At one end of the piece 12 is a first junction 14 to a first piece of a nonsuperconducting material 16. At the other end of the piece 12 is a second junction 18 to a second piece of a nonsuperconducting material 20. A heat sink 22 that operates at, or produces, a preselected heat sink temperature is in thermal communication with the first junction 14.

The terms "superconducting" and "nonsuperconducting" material as used herein refer to properties of materials at the preselected temperature of the heat sink 22. Thus, at temperatures equal to or below that of the preselected temperature of the heat sink 22, and under the current flow operating conditions of the refrigerating unit 10, the "superconducting material" 12 is carrying a subcritical current in the superconducting mode. That is, the current carriers are paired in the lowest condensed entropy state, the material exhibits no electrical resistance, and has the other characteristics of a superconducting material. The "nonsuperconducting materials" 16 and 20 are carrying a supracritical current in the nonsuperconducting mode. That is, the current carriers are energetically in the excited entropy state and the material exhibits an electrical resistance.

At some temperature above that of the preselected temperature of the heat sink 22, the "superconducting material 12" transforms to a normal conductor. The temperature of transformation is known as the critical temperature $T_c$ of the material, in the absence of an applied electrical current or magnetic field. The temperature of transformation for the superconducting material 12 is preferably chosen to be somewhat above that of the preselected temperature of the heat sink 22, to ensure that the superconducting material 12 will not be driven normal by a high electrical current or high applied magnetic field, either of which may be experienced in operation.

A source of electrical current 24 is connected through an external circuit current path 26 to the first piece 16 and second piece 20. The source 24 is connected so that electrons pass through the superconductor piece 12 in the indicated direction, from the first piece 16, through the first junction 14, through the superconducting piece 12, through the second junction 18, and into the second piece 20. (In normal electrical terminology, this would amount to an electrical current in the opposite direction.)

As electrons pass through the refrigerating unit 10, heat energy flows from a cooling load or environment 28, which normally includes an electronic or other type of device that is to be cooled, into the unit 10 in the vicinity of the second junction 18. Heat energy flows from the unit 10 in the vicinity of the first junction 18 to the heat sink 22. The region of the second junction 18 therefore tends to become cooler, and is termed the cold end 30. The region of the first junction 14 is warmer than the cold end 30, and is therefore termed the hot end 32 (even though its temperature is normally fixed as the preselected temperature of the heat sink 22).

In this manner, the unit 10 removes heat from the cold end 30 and its environment 28, and conveys it to the heat sink 22 at the hot end 32 and thence away.

While not wishing to be bound by this possible explanation, it is believed that the cooling effect of the unit 10 results from electronic transformations and entropy changes that occur when electrons pass from the superconducting state to the nonsuperconducting state at the second junction 18, and from the nonsuperconducting state to the superconducting state at the first junction 14. Electrons in the superconducting material 12 are in an energy state lower than in either of the nonsuperconducting pieces 16 or 20. It is believed that the electrons in the superconducting material are arranged as Cooper pairs, while those in the nonsuperconducting material are conventional lattice electrons or excitons. Energy is required to raise the energy state of the electrons at the second junction 18, and that energy is absorbed from the cooling load 28. Energy is released as the energy state of the electrons is lowered at the first junction 14, and that energy is removed through the heat sink 22. Energy, in the form of heat, is thereby removed from the cooling load 28 at the cold end 30, and transmitted to the heat sink 22 at the hot end 32. Whether this possible explanation is correct does not alter the fact that the refrigerating effect occurs.

Thus, alternatively stated, a refrigerating device comprises a hot end from which heat is transferred from the device to the external environment, and which is maintained within a preselected temperature range during operation of the refrigerating device; a cold end at which heat is transferred from an external cooling load to the device; and at least one refrigerating unit, each such refrigerating unit including a first junction at the hot end, the first junction being formed between a material that can carry an electrical current in a nonsuperconducting mode and a material that can carry an electrical current in a superconducting mode in the preselected temperature range, and a second junction at the cold end, the second junction being formed between a material that can carry electrical current in a superconducting mode and a material that can carry electrical current in a nonsuperconducting mode, the first junction and the second junction being in electrical communication.

A single refrigerating unit 10 of the type illustrated in FIG. 1 produces a low net heat flow, or cooling power. A number of these units may be combined in different arrangements to increase the cooling power, as illustrated in FIGS. 2 and 3.

Figure 2:
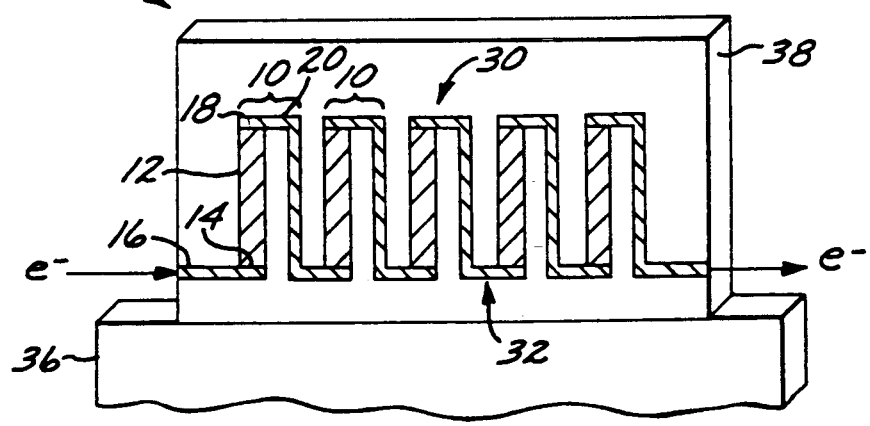
FIG. 2 is a schematic perspective view of a refrigerating device utilizing multiple refrigerating units.
Figure 3:
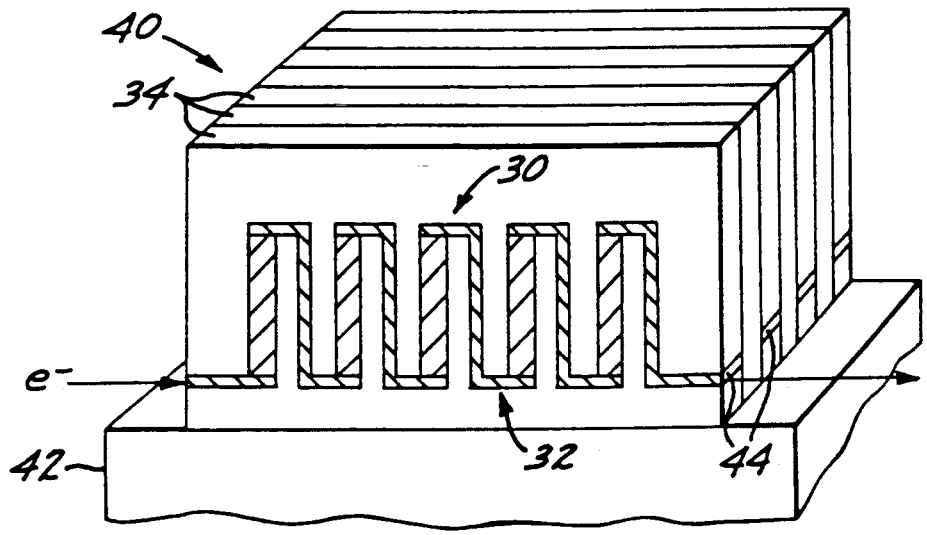
FIG. 3 is a schematic perspective view of a refrigerating device utilizing multiple refrigerating units and multiple substrates.

Referring to FIG. 2, a refrigerating device 34 includes at least two, and preferably a plurality of, refrigerating units 10 connected together in an electrical series arrangement, but working from the same heat sink, to multiply the cooling power of the device. A refrigerating device 34 includes a plurality of refrigerating units 10 of the type discussed previously. The far left of the depicted units 10 is labelled to show the corresponding elements of FIG. 1, and each of the similarly configured units 10 has similar elements. The external electrical circuit is not shown in FIG. 2, except that the electron flow is indicated. FIG. 2 shows five of the refrigerating units 10, connected so that, for each device 10, electrons flow from the first piece 16, through the junction 14, through the superconducting material 12, through the junction 18, and into the second piece 20. The second piece 20 then becomes the first piece for the next refrigerating unit in electrical series connection. A single heat sink 36 is disposed adjacent all of the first junctions 14, so that the multiple refrigerating units 10 all act to produce the same temperature at the cold end 30. Thus, the cooling or temperature difference of the device 34 is the same as any individual refrigerating unit 10, but the total heat removed from the cold end 30 is a multiple, here five times, of the heat removed by a single unit 10.

FIG. 2 also illustrates the preferred approach for fabricating the refrigerating units 10 and the device 34. The superconducting mode piece 12 and the nonsuperconducting mode pieces 16 and 20 are deposited as a thin or thick film in the required pattern on an electrically insulating substrate 38, which is preferably a glass slide. A single layer of material is deposited onto the slide, using whatever technique is operable for the particular superconductor material chosen. Then the required pattern widths, which vary between the conductive sections, are etched into the deposited layer, thereby forming the variable width conductive paths and junctions form the superconductor layer material. By varying the width of a conductive path and keeping its thickness relatively constant, the cross sectional area of the conductive path is varied proportionally to the conductive path width.

The result is that a device having superconducting regions and nonsuperconducting regions made of the same material may be fabricated, the superconducting regions and the nonsuperconducting regions being different in that they have different cross sectional path areas through which the current flows. The path area of the nonsuperconducting regions is selected so that the current flow is greater than the critical current to drive the region normal. The path area of the superconducting region is larger, and is selected so that the current flow is less than the critical current for the material, so that it is in the superconducting state.

Figure 6:
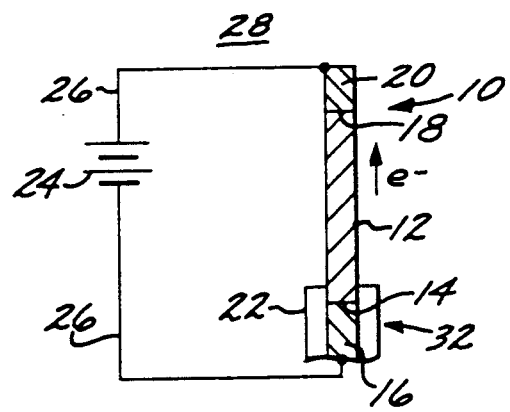
FIG. 6 is a schematic plan view of another embodiment of a single refrigerating unit on a substrate.

In another approach which will be discussed in relation to FIG. 6, different materials may be used as the superconductor and nonsuperconductor materials, and can be deposited in a series of steps.

Another refrigerating device 40 having even greater cooling power is illustrated in FIG. 3. A number of the refrigerating devices 34 are supported upon a common heat sink 42. Each device 34 functions in the manner previously discussed. The devices are connected in an electrical series arrangement through edge connections 44. Since the devices 34 are operated from the common heat sink 42 at the hot end 32, the temperature reduction from the hot end 32 to the cold end 30 is the same as for a single unit 10. However, the cooling power of the device 40 is a multiple of the cooling power of a single unit 10. For example, if the device 40 has seven of the devices 34, each of which has five of the refrigerating units 10, the total cooling power of the device 40 is thirty-five times that of a single unit 10.

Figure 4:
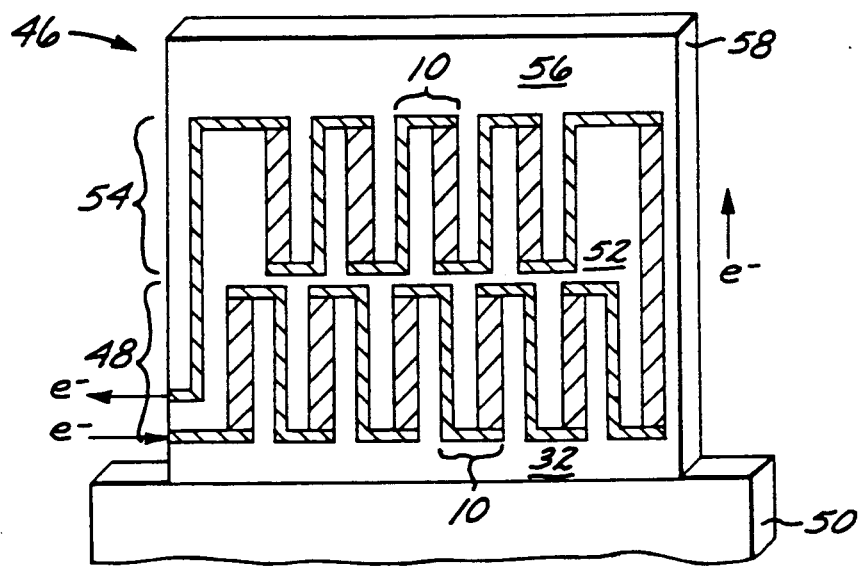
FIG. 4 is a schematic perspective view of a multistage refrigerating device employing multiple refrigerating units.

The temperature difference achieved by the unit 10 and the devices 34 and 40, from the hot end to the cold end, is essentially the same. A greater difference can be attained by arranging the refrigerating units 10 in multiple stages of cooling, as illustrated in FIG. 4. A multistage refrigerating unit 46 is constructed from at least two, and preferably a plurality, of the refrigerating units 10 connected in an end-to-end manner.

A first stage 48 of refrigerating units has at least one, and preferably a plurality, of the refrigerating units 10. Where there are more than one of the units 10, they are connected in an electrical series arrangement as was described for the device 34. The hot end 32 of the first stage refrigerating units is contacted to a heat sink 50 operating at a preselected temperature. The cold end 52 of the first stage 48 is at a temperature lower than that of the heat sink 50.

A second stage 54 of refrigerating units has at least one, and preferably a plurality, of the refrigerating units 10. The electron flow through these second stage units 54 is in series with those of the first stage units 48. The second stage 54 of refrigerating units is physically arranged so that its "hot end" is adjacent the cold end 52 of the first stage units 48. Thus, the cold end 56 of the second stage units 54 is at a temperature even lower than the cold end 52 of the first stage units 48. Heat extracted from the cooling load at the cold end 56 of the second stage units 54 is transferred to the cold end 52 of the first stage units 48, and thence to the heat sink 50. Alternatively stated, the cold end 52 of the first stage units 48 becomes the heat sink for the second stage units 54.

Modifications to the approach of FIG. 4 can be made to increase the temperature difference and the cooling power. In FIG. 4, the refrigerating units 10 that comprise the two stages are deposited upon a common substrate 58. Further stages could be provided to attain even lower temperatures, with those stages formed on the same substrate or a different substrate in thermal communication with the first substrate in the manner discussed. A larger cooling power can be attained using a multiple substrate approach like that of FIG. 3.

Figure 5:
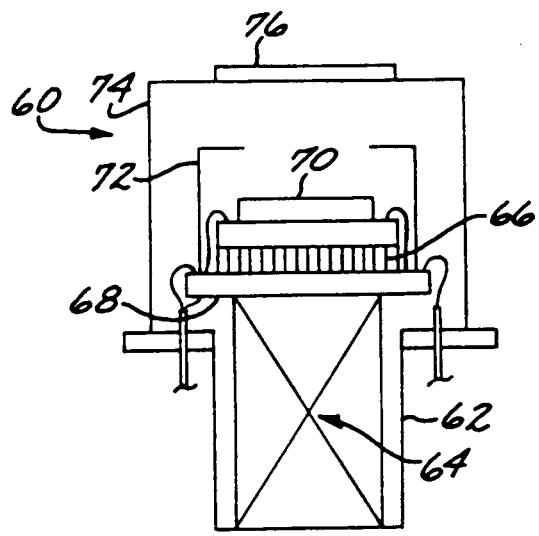
FIG. 5 is a side sectional view of a sensor utilizing a refrigerating unit of the invention.

A typical application of the refrigerating units and devices of the invention is illustrated in FIG. 5. A sensor 60 includes a vacuum dewar 62 containing at one end a Joule-Thompson gas expansion cryostat 64 using argon gas. The cryostat 64, which operates at a preselected temperature of about 87K, serves as a heat sink for a refrigerating device 66, which is mounted on the end of the cryostat 64 and in thermal communication with it. The device 66 may be of the types illustrated in FIGS. 2-4, and normally is of the type illustrated in FIG. 3 for a single stage of cooling or in FIG. 4 for multiple stages of cooling. For handling purposes, the refrigerating device 66 is supported on a ceramic carrier board 68.

Mounted on the cold end of the device 66 is a detector 70, operating at a temperature of about 80K or lower. Thus, the refrigerating device 66 provides about 7 degrees K of cooling relative to the cryostat 64. The carrier board 68, with the refrigerating device 66 and the detector 70 mounted thereupon, are insulated from background radiation by a metallic cold shield 72, inside a protective housing 74. A window 76 permits energy of the proper wavelength to enter the sensor 60 and fall upon the detector 70.

The refrigerating device 66 is made utilizing a single material having the capability of operating in either the superconductor or the nonsuperconductor modes. The same material may be used as either the superconducting material 12 or the nonsuperconducting material 16 or 20. This dual behavior is achieved by making the cross sectional area of the current path large for the superconductor material 12, and small for the nonsuperconductor material 16 or 20. An impressed current flowing through the current path of small dimension drives the material to the nonsuperconducting state.

To operate at a temperature of less than 87K, the superconducting material 12 is preferably Tl-Ca-Ba-Cu-O. Each of the superconducting mode pieces 12 which are deposited upon glass slides in the manner discussed for the device 34, have dimensions of about 1000 micrometers thick and 0.4 centimeters wide. The nonsuperconducting mode pieces 16 and 20 have dimensions of about 1000 micrometers thick and 0.04 centimeters wide. When a current of one ampere is passed through each refrigerating unit 10, the cooling power is about 10 milliwatts. For the application in the sensor 60, a cooling power of about 150 milliwatts is required, so a total of 15 of the refrigerating units 10 is needed to supply that cooling power. In one approach, three slide substrate are prepared with five units 10 per slide in series, and the three slide substrates are connected together in series as depicted in FIG. 4.

In constructing the refrigerating units 10, the choice of superconducting material depends upon the operating temperature of the heat sink. Some examples of superconducting materials, and their approximate maximum operating temperatures, include the R-Ba-Cu-O system where R is a rare earth or yttrium, such as $YBa_2Cu_3O_{7-x}$ with $T_c$ of 93K; the La-M-Cu-O system where M is one of the alkaline earths Ba, Sr, or Ca, such as $La_{4.25}Ba_{0.75}Cu_5O_{5(3-x)}$ with $T_c$ of 35K; the Bi-Ca-Sr-Cu-O system such as $Bi_{1.9}Ca_{0.9}Sr_{0.9}Cu_2O_8$ with $T_c$ of 115K; and the Tl-Ca-Ba-Cu-O system such as $Tl_2Ca_2Ba_2Cu_3O_x$ with $T_c$ of 120K.

The embodiments of FIGS. 1-4 have been based upon the use of a single material to achieve either the superconductor or nonsuperconductor mode through changes in the cross sectional area of the current path. An alternative approach is illustrated in FIG. 6, where the elements are indicated by the same numerals as used in FIG. 1. In this embodiment, two different materials are used as the superconductor and nonsuperconductor pieces, and the cross sectional areas of the various current paths are the same. For example, any of the superconductor materials previously discussed can be the superconductor material. The nonsuperconductor material is preferably a nonsuperconducting material having good electrical conductivity at the temperature of operation, such as high purity aluminum. The basic unit of FIG. 6 can be used in any of the types of arrangements and devices as the unit of FIG. 1, such as those of FIGS. 2-5.

The refrigerating approach of the present invention provides an important advance in the art of low-temperature cooling. The devices operating upon the superconducting mode/nonsuperconducting mode approach of the invention can operate to very low cold end temperatures near absolute zero, with high cooling powers. The devices are readily constructed using known thin film or other manufacturing techniques, and can be heat sinked to any appropriate type of sink, such as, for example, a liquid gas reservoir or a gas expansion cooler. Although particular embodiments of the invention have been described in detail for purposes of illustration, various modifications may be made without departing from the spirit and scope of the invention. Accordingly, the invention is not to be limited except as by the appended claims.

What is claimed is:

1. A refrigerating device that produces cooling below a preselected temperature, comprising:
   a heat sink operable to produce the preselected temperature;
   a refrigerating unit, including
      a first piece of a first material that is electrically conducting but not superconducting at the preselected temperature,
      a second piece of a second material that is superconducting at the preselected temperature, the second piece being electrically connected to the first piece at a first junction, the first piece and the heat sink in the region of the first junction, and a third piece of a third material that is electrically conducting but not superconducting at the preselected temperature, the third piece being electrically connected to the second piece at a second junction, wherein the first material, the second material, and the third material are of the same composition, and the cross sectional areas of the first piece and the third piece are smaller than the cross sectional area of the second piece; and means for causing an electrical current to flow from the first piece, into the second piece, and into the third piece.

2. The refrigerating device of claim 1, further including a second refrigerating unit having substantially the same construction as the refrigerating unit of claim 1, wherein the second refrigerating unit is electrically connected in series with the refrigerating unit such that the electrical current flows from the third piece of the refrigerating unit to the first piece of the second refrigerating unit.

3. The refrigerating device of claim 1, further including a plurality of refrigerating units, each having substantially the same construction as the refrigerating unit of claim 1, wherein all of the refrigerating units are electrically connected in series.

4. A refrigerating device, comprising:
a refrigerating unit, including
a first piece of a first material that carries current in the nonsuperconducting mode,
a second piece of a second material that carries current in the superconducting mode.
a third piece of a third material that carries current in the nonsuperconducting mode,
a first junction between the first piece of material and the second piece of material, and
a second junction between the second piece of material and the third piece of material;
heat sink means adjacent and in thermal communication with the first junction for maintaining the second piece of material below its superconducting transition temperature; and
electrical current means for causing an electrical current to flow from the first piece of material, through the second piece of material, and into the third piece of material.

5. The refrigerating device of claim 4, wherein the first material, the second material, and the third material are of the same composition, and the cross sectional areas of the first piece and the third piece are smaller than the cross sectional area of the second piece.

6. The refrigerating device of claim 4, wherein the first material and the third material are of the same composition, and the second material is of a different composition.

7. The refrigerating device of claim 4, wherein the second piece of material is an n-type superconductor, and the electrical current means causes a current of electrons to flow.

8. The refrigerating device of claim 4, wherein the second piece of material is an p-type superconductor, and the electrical current means causes a current of holes to flow.

9. The refrigerating device of claim 4, wherein at least one of the nonsuperconductor materials is aluminum.

10. The refrigerating device of claim 4, further including a second refrigerating unit having substantially the same construction as the refrigerating unit of claim 6, wherein the second refrigerating unit is electrically connected in series with the refrigerating unit such that the electrical current flows from the third piece of the refrigerating unit to the first piece of the second refrigerating unit.

11. The refrigerating device of claim 4, further including a plurality of refrigerating units, each having substantially the same construction as the refrigerating unit of claim 4, wherein all of the refrigerating units are electrically connected in series.

12. A refrigerating device, comprising:
a hot end from which heat is transferred from the device to the external environment;
a cold end at which heat is transferred from an external cooling load to the device;
at least one refrigerating unit, each such refrigerating unit including
a first junction at the hot end, the first junction being formed between a material that can carry an electrical current in a nonsuperconducting mode and a material that can carry an electrical current in a superconducting mode, and
a second junction at the cold end, the second junction being formed between a material that can carry electrical current in a superconducting mode and a material that can carry electrical current in a nonsuperconducting mode, the first junction and the second junction being in electrical communication; and
means for maintaining each material that can carry an electrical current in a superconducting mode within its superconducting range.

13. The refrigerating device of claim 12, wherein the materials forming the first junction and the materials forming the second junction are all the same material.

14. The refrigerating device of claim 12, wherein one of the materials forming the first junction is of the same composition as one of the materials forming the second junction.

15. The refrigerating device of claim 12, further including an electrical current source that causes an electrical current to flow serially through the first junction and the second junction.

16. The refrigerating device of claim 12, wherein each refrigerating unit is formed as a thin film structure on a substrate.

17. The refrigerating device of claim 12, wherein each refrigerating unit is formed as a thin film structure, and a plurality of the refrigerating units are deposited upon a single substrate.

18. The refrigerating device of claim 12, further including a second refrigerating unit having substantially the same construction as the refrigerating unit of claim 12, wherein the second refrigerating unit is electrically connected in series with the refrigerating unit.

19. The refrigerating device of claim 12, further including a plurality of refrigerating units, each having substantially the same construction as the refrigerating unit of claim 12, wherein all of the refrigerating units are electrically connected in series.

20. The refrigerating device of claim 12, wherein the refrigerating unit of claim 12 provides a first stage of refrigerating, and further including a second stage of refrigerating having
at least one refrigerating unit, each such refrigerating unit including
a first junction adjacent the cold end of the first stage, the first junction being formed between a material that can carry current in a nonsuperconducting mode at the temperature of the cold end of the first stage and a material that can carry current in a superconducting mode at the temperature of the cold end of the first stage, and a second junction at a location spaced apart from the cold end of the first age, the second junction being formed between a material that can carry electrical current in a superconducting mode at the temperature of the cold end of the first stage and a material that can carry electrical current in a nonsuperconducting mode at the temperature of the second junction.

21. The refrigerating device of claim 12, wherein at least one of the materials that can carry an electrical current in the nonsuperconducting mode is aluminum.

* * * * *

UNITED STATES PATENT AND TRADEMARK OFFICE
CERTIFICATE OF CORRECTION

PATENT NO. : 5,057,490
DATED : October 15, 1989
INVENTOR(S) : Matthew M. Skertic It is certified that error appears in the above-identified patent and that said Letters Patent is hereby corrected as shown below:

Column 8, line 66, after "and" insert --the second piece being in thermal communication with--

Signed and Sealed this

Fourth Day of May, 1993

Attest:

MICHAEL K. KIRK

Attesting Officer

Acting Commissioner of Patents and Trademarks